United States Patent
Schaefer et al.

(10) Patent No.: US 7,622,051 B1
(45) Date of Patent: Nov. 24, 2009

(54) METHODS FOR CRITICAL DIMENSION CONTROL DURING PLASMA ETCHING

(75) Inventors: David M. Schaefer, Sunnyvale, CA (US); Gowri P. Kota, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 775 days.

(21) Appl. No.: 10/401,100

(22) Filed: Mar. 27, 2003

(51) Int. Cl.
*B44C 1/22* (2006.01)
*H01L 21/302* (2006.01)

(52) U.S. Cl. .............................. 216/67; 216/74; 216/79; 438/706; 438/710

(58) Field of Classification Search .................... 216/67, 216/74, 79; 438/706, 710
See application file for complete search history.

(56) References Cited

U.S. PATENT DOCUMENTS

| | | | |
|---|---|---|---|
| 5,980,768 | A | 11/1999 | Abraham |
| 6,432,318 | B1 | 8/2002 | Ding et al. |
| 6,458,671 | B1 * | 10/2002 | Liu et al. .................. 438/391 |
| 6,569,778 | B2 * | 5/2003 | Lee et al. .................. 438/734 |
| 6,583,065 | B1 * | 6/2003 | Williams et al. ........... 438/714 |
| 6,599,437 | B2 * | 7/2003 | Yauw et al. ................. 216/47 |
| 6,703,315 | B2 * | 3/2004 | Liu et al. .................... 438/706 |
| 6,933,236 | B2 * | 8/2005 | Lee et al. .................... 438/695 |

OTHER PUBLICATIONS

Hawana, Tetsuro, "Current Status of Photolithography/Etching," Manufacturing Technology Research Dept., Dec. 8, 2000, 10 slides total.
Lamb III, James E., "Organic ARC Anti-Reflective Coating Application within the Microelectronics Industry," http://www.semiconductorfabtech.com/features/lithography/articles/body2.223.php3, 10 pp, Aug. 16, 2002.
Zalicki, Piotr S., "Trench and Recess Etch Endpoint by Optical Interferometry," SC Technology, Oct. 1999, 22 pp.

* cited by examiner

*Primary Examiner*—Shamim Ahmed
(74) *Attorney, Agent, or Firm*—IP Strategy Group, P.C.

(57) ABSTRACT

A method of etching a substrate in a plasma processing chamber is disclosed. The method includes introducing the substrate having thereon an underlying layer, an anti-reflective layer above the underlying layer, and a photo-resist layer above the anti-reflective layer into the chamber. The method also includes flowing a gas mixture into the chamber, the gas mixture includes a flow of a hydrofluorocarbon gas, a flow of fluorocarbon gas, a flow of a halogen-containing gas other than the hydrofluorocarbon gas, and a flow of oxygen gas. The method further includes striking a plasma from the gas mixture. The method additionally includes etching at least through the anti-reflective layer with the plasma.

20 Claims, 8 Drawing Sheets

METHODS FOR CRITICAL DIMENSION CONTROL DURING PLASMA ETCHING

BACKGROUND OF THE INVENTION

The present invention relates in general to substrate manufacturing technologies and in particular to methods for improving process results while etching in a plasma processing chamber.

In semiconductor fabrication, devices such as component transistors may be formed on a substrate, e.g., a semiconductor wafer or a glass panel. Above the substrate, there may be disposed a plurality of layers from which the devices may be fabricated. Metallic interconnect lines, which may be etched from a metal layer disposed above the substrate, may then be employed to couple the devices together to form the desired circuit.

In an exemplary plasma process, the wafer is coated with a layer of photoresist which is patterned in a lithographic step, and subsequently etched in a plasma step. Using appropriate etchants, such as chlorine, HBr, and fluorocarbon gases for example, areas of the certain layers (e.g., the polysilicon layer) that are unprotected by the mask are etched away, leaving behind columns and trenches that form electrical structures on the substrate. The plasma processing system further uses a technique called process endpoint detection to determine precisely when to stop the etching process. An exemplary technique is optical emission spectroscopy.

Fluorocarbon gases that are typically used in the plasma etch process can, however, cause excess lateral etching along trench walls of the photoresist layer and/or the bottom anti-reflective coating layer. The use of such etchant gases may increase the width of a trench, and therefore decreasing the width of the surrounding columns. This effect, commonly called CD bias, is normally measured as the difference in width of a specific feature after etching relative to the width just before etching. Minimizing CD bias can be critical to the manufacturing process since it directly impacts the performance and function of the resultant devices.

Figure 1A:
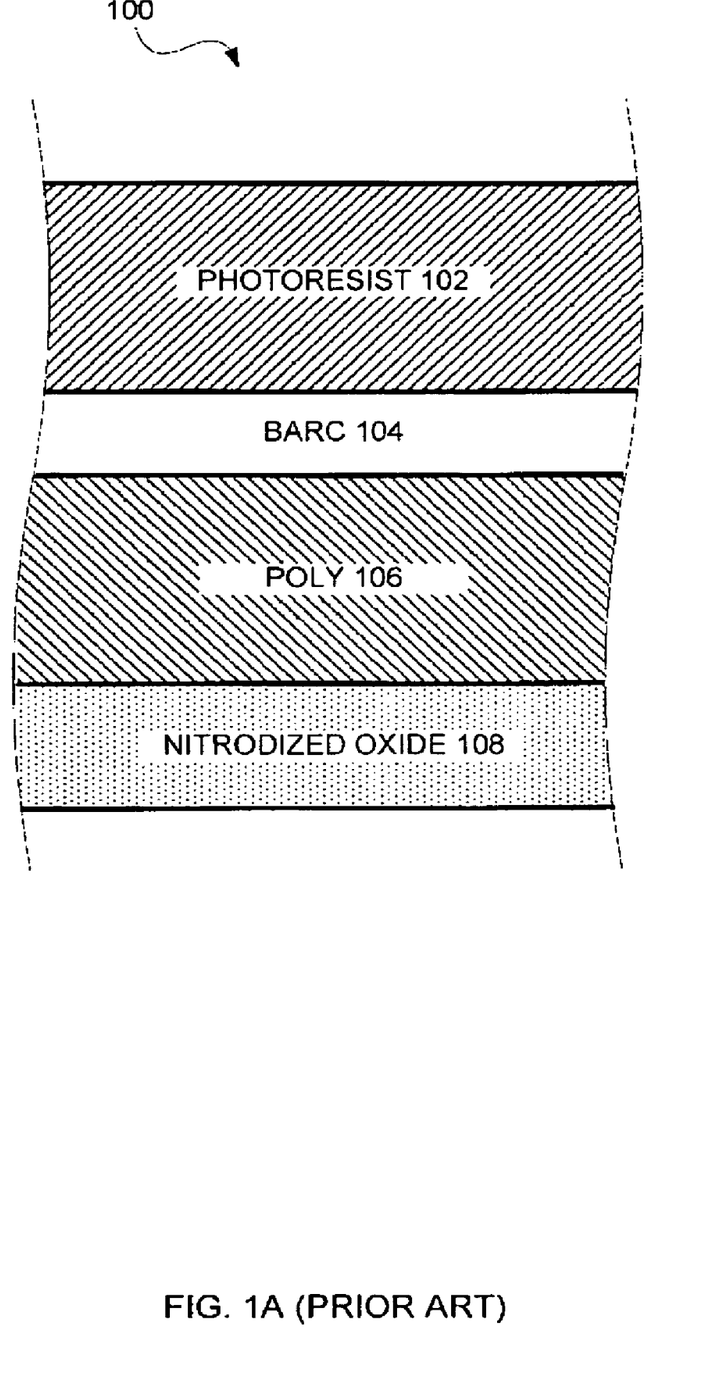
FIG. 1A illustrates a cross-sectional view of a layer stack 100, representing the layers of an exemplar semiconductor IC prior to a lithographic step.

To facilitate discussion, FIG. 1A illustrates a cross-sectional view of a layer stack 100, representing the layers of an exemplar semiconductor IC, prior to a lithographic step. In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. Further, not all of the shown layers need necessarily be present and some or all may be substituted by other different layers.

At the bottom of layer stack 100, there is shown a nitrodized oxide layer 108, typically comprising $SiO_2$. Above the nitrodized oxide layer 108, there is disposed a polysilicon layer 106. Above the polysilicon layer 106, there is disposed a BARC (bottom anti-reflective coating) layer 104. The BARC layer 104 helps prevent light (e.g., from the lithography step that patterns the photoresist) from being reflected and scattered off the surface of the polysilicon layer 106. Above the BARC layer 104 is an overlaying photoresist layer 102.

Photoresist layer 102 is commonly patterned for etching through exposure to ultra-violet rays. By way of example, one such photoresist technique involves the patterning of photoresist layer 102 by exposing the photoresist material in a contact or stepper lithography system to form a mask that facilitates subsequent etching.

Figure 1B:
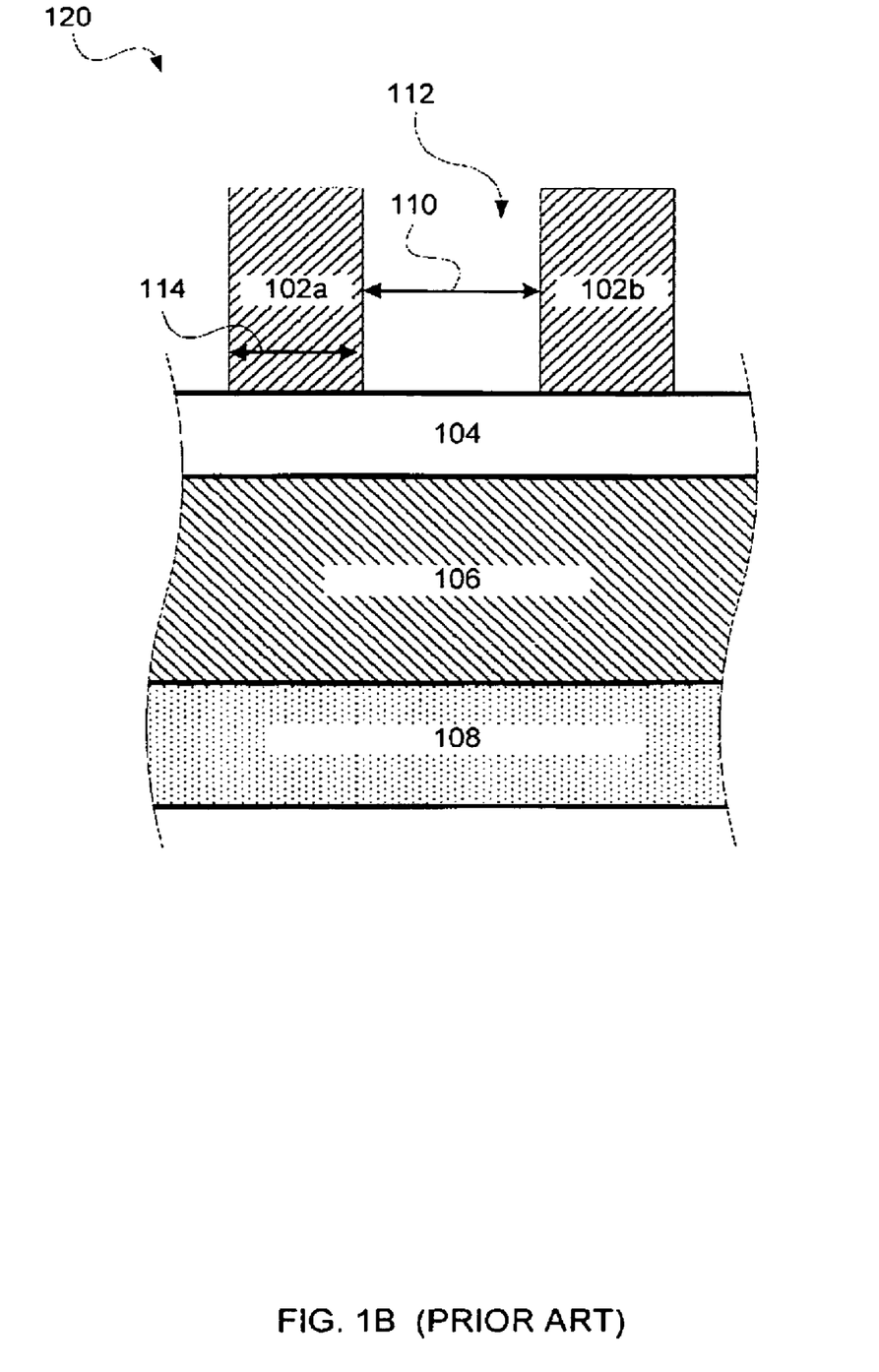
FIG. 1B shows a somewhat idealized cross-sectional view of the layer stack of FIG. 1A after the photoresist layer has been processed through lithography.

For illustration purposes, FIG. 1B shows a somewhat idealized cross-sectional view of layer stack 100 of FIG. 1A after photoresist layer 102a-b is has been processed through lithography. In this example, trench 112 has been removed, leaving two columns of photoresist 102a-b. Since modern IC circuits are scaled with increasingly narrower design rules to achieve greater circuit density, feature sizes (i.e., the width of the interconnect lines or trenches between adjacent interconnect lines) have steadily decreased.

Figure 1C:
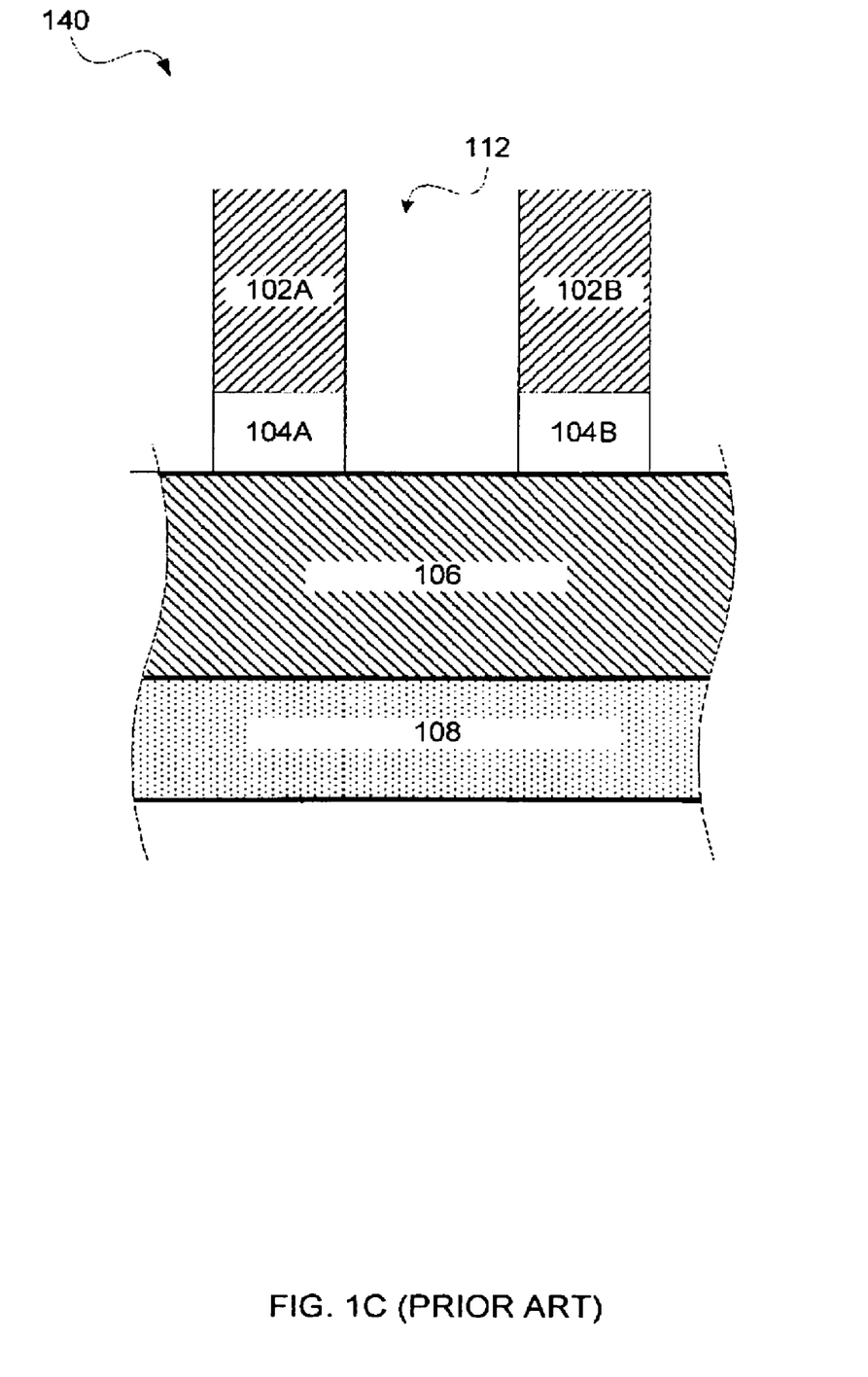
FIG. 1C shows an idealized cross-sectional view of the layer stack of FIG. 1B after the BARC layer has been etched in the plasma system.
Figure 1D:
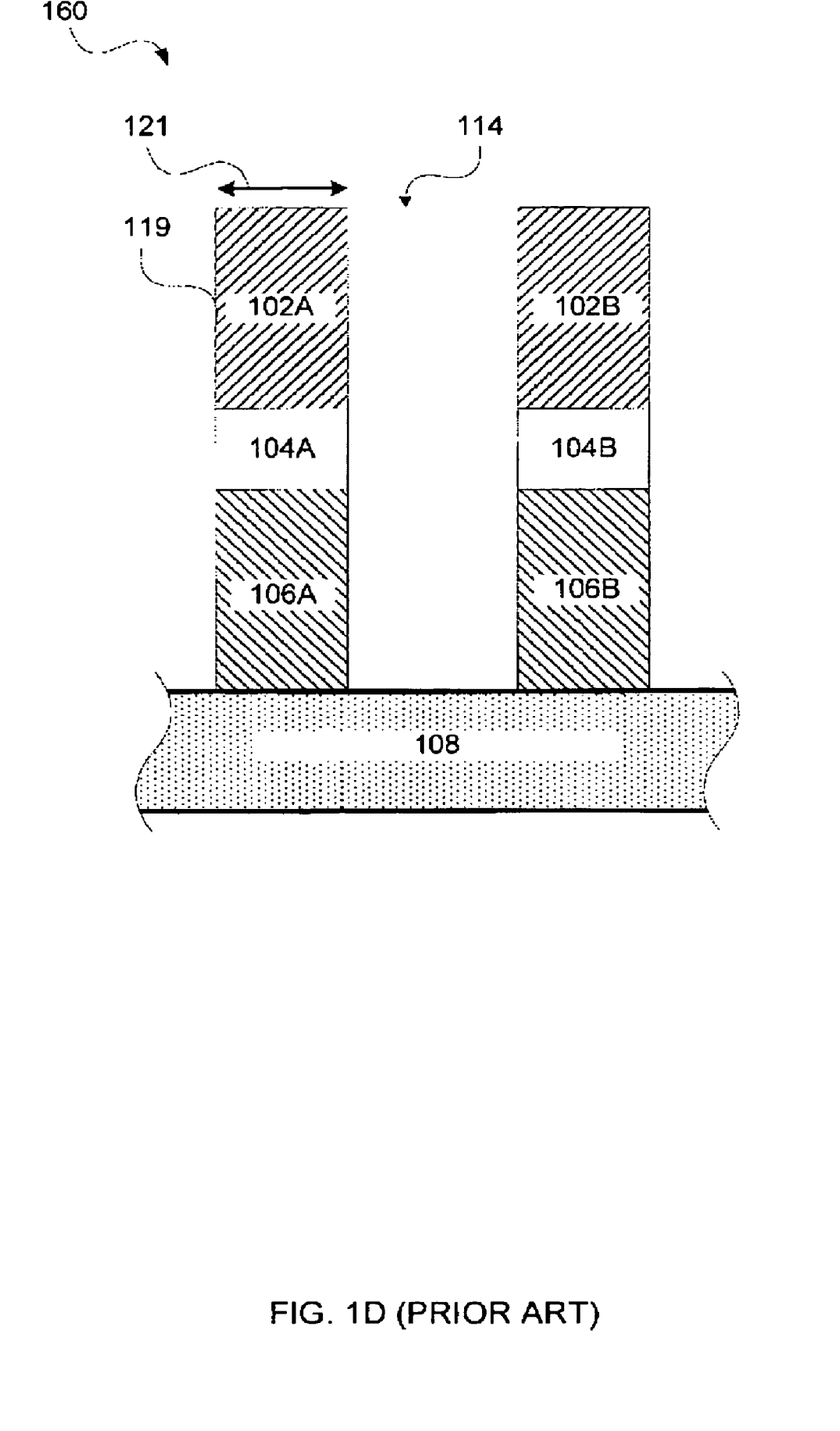
FIG. 1D shows an idealized cross-sectional view of the layer stack of FIG. 1C after the polysilicon layer has been etched in the plasma system.

FIG. 1C shows an idealized cross-sectional view of layer stack 120 of FIG. 1B after the BARC layer has been etched in the plasma system. FIG. 1D further shows an idealized cross-sectional view of layer stack 140 of FIG. 1C after the polysilicon layer has been etched in the plasma system.

As the feature sizes shrink, however, it becomes increasingly difficult to maintain the CD of the columns and trenches that form the substrate's IC components. Fluorocarbon-based etchants, although being very efficient and widely available, are often very difficult to control in plasma processing systems, causing excess vertical and/or lateral etching on the features. To counter the tendency of fluorocarbon-based etchants to over etch, it is not uncommon for mask designers to purposely distort feature dimensions on the mask in order to compensate for the over etching, consequently decreasing accuracy and increasing design complexity and cost.

In view of the foregoing, there are desired improved methods for CD control using fluorocarbon-based chemistry in a plasma process system.

SUMMARY OF THE INVENTION

The invention relates, in one embodiment to a method of etching a substrate in a plasma processing chamber. The method includes introducing the substrate having thereon an underlying layer, an anti-reflective layer above the underlying layer, and a photo-resist layer above the anti-reflective layer into the chamber. The method also includes flowing a gas mixture into the chamber, the gas mixture includes a flow of a hydrofluorocarbon gas, a flow of fluorocarbon gas, a flow of a halogen-containing gas other than the hydrofluorocarbon gas, and a flow of oxygen gas. The method further includes striking a plasma from the gas mixture. The method additionally includes etching at least through the anti-reflective layer with the plasma.

In another embodiment, the invention relates to a method of etching a substrate in a plasma processing chamber. The method includes introducing the substrate having thereon an underlying layer, an anti-reflective layer above the underlying layer, and a photo-resist layer above the anti-reflective layer into the chamber. The method also includes flowing a gas mixture into the chamber, the gas mixture comprising a flow of a hydrofluorocarbon gas, a flow of a halogen-containing gas other than the hydrofluorocarbon gas, and a flow of oxygen gas. The method further includes striking a plasma from the gas mixture. The method additionally includes etching the substrate with the plasma.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2B illustrates a cross-sectional view of the layer stack of FIG. 2A after the polysilicon layer is etched through.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As mentioned, the fluorocarbon-based etchants laterally attack the sidewalls of the photoresist features and the sidewalls of the features in the BARC layer during plasma etching. Accordingly, the CD bias is disadvantageously increased. In some cases, the fluorocarbon-based etchants may have a heightened affinity for the BARC material, relative to the other materials along the column face. For example, fluorocarbon-based etchants appear to attack the BARC layer at a greater rate than the photoresist and polysilicon layers, resulting in additional areas of cavities or pits in the BARC layer along the column walls, further increasing the overall CD bias.

Figure 2A:
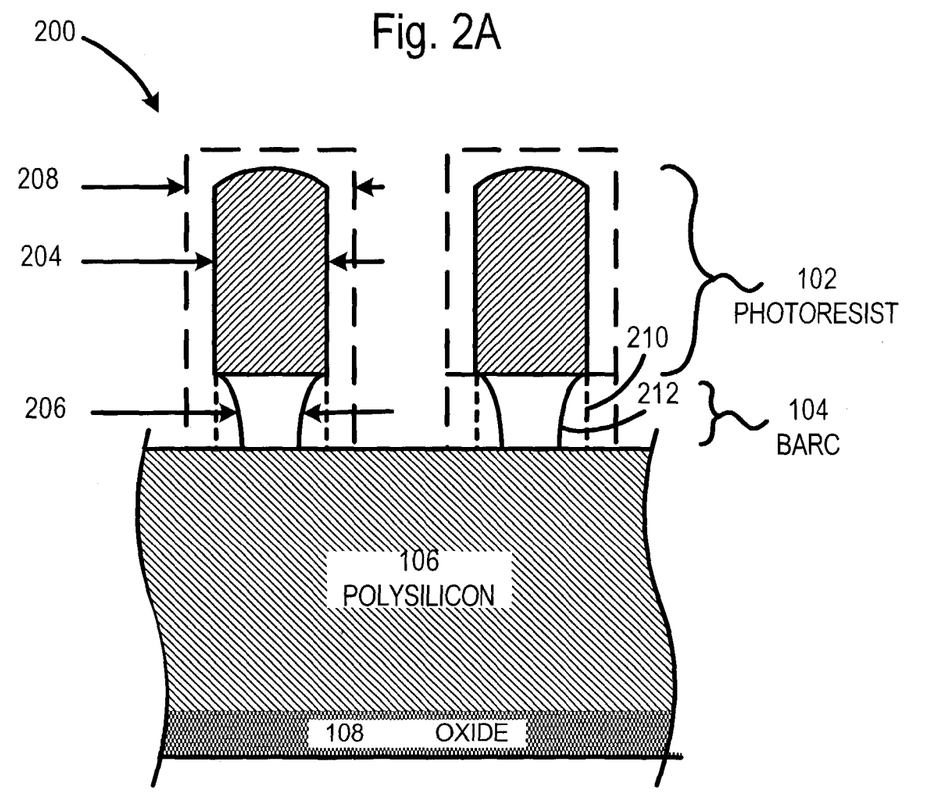
FIG. 2A illustrates a cross-sectional view of a layer stack in which the fluorocarbon-based plasma has laterally etched the photoresist layer and the BARC layer and increased the overall CD bias.

To facilitate discussion, FIG. 2A illustrates a cross-sectional view of a layer stack 200 in which the fluorocarbon-based plasma has laterally etched the photoresist layer and the BARC layer and increased the overall CD bias. As the fluorocarbon-based plasma etches downward through layer stack 200, the fluorocarbon-based plasma also attacks the vertical sidewalls of the photoresist layer 102 and the BARC layer 104. Accordingly, the lateral dimension 204 in photoresist layer 102 and the lateral dimension 206 in BARC layer 104 are smaller than idealized lateral dimension 208.

In some layer stacks, BARC layer 104 is etched laterally at substantially the same rate as the lateral etch into the photoresist layer and thus lateral dimension 206 may be substantially the same as lateral dimension 204 (illustrated by line 210). In other layer stacks, BARC layer 104 is etched laterally to a greater extent than the lateral etch into the photoresist layer and thus lateral dimension 206 may be smaller than lateral dimension 204 (illustrated by line 212).

Figure 2B:
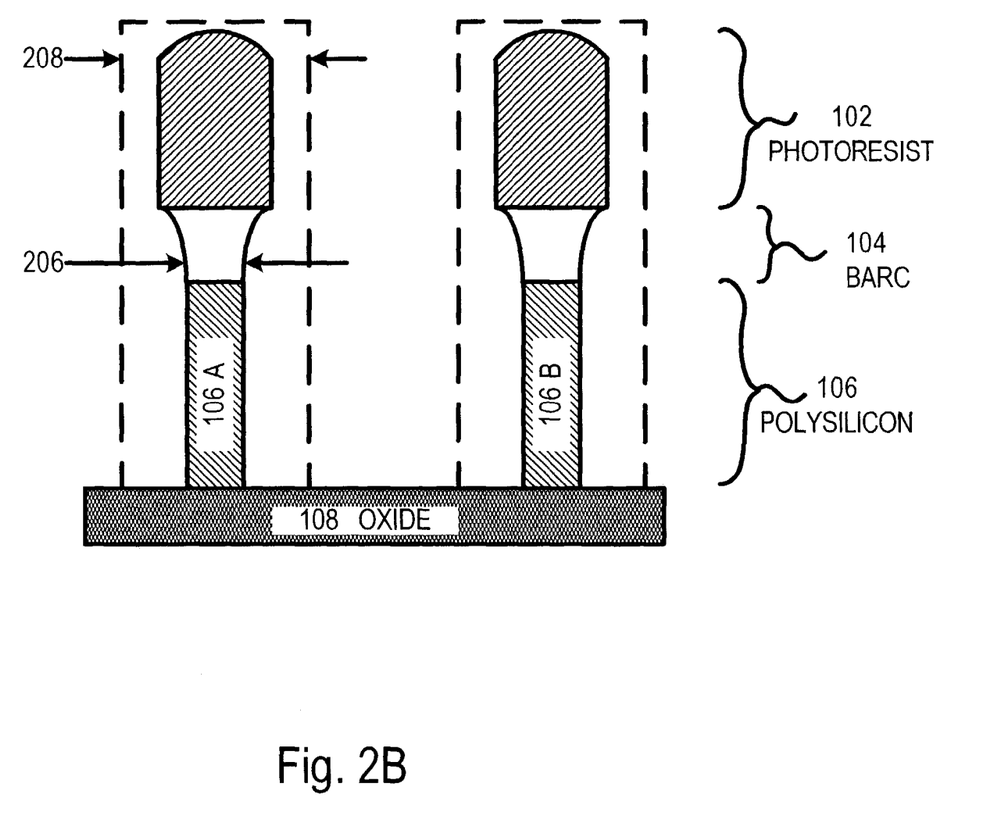

FIG. 2B illustrates a cross-sectional view of layer stack 200 of FIG. 2A after polysilicon layer 106 is etched through. In the case of FIG. 2B, the lateral dimension 206 in the BARC layer is carried downward, thereby causing the polysilicon columns 106A and 106B to have a smaller lateral dimension than intended.

In accordance with one aspect of the invention, a hydrofluorocarbon gas is advantageously employed in the plasma etch process to attenuate lateral etching along the column faces of the BARC layer and/or the photoresist layer, thereby reducing the CD bias and increasing the overall tunability of the plasma process. For example, the addition of $CH_2F_2$ (a hydrofluorocarbon gas) to $CF_4$ (a fluorocarbon gas) in a plasma system can substantially reduce the CD bias. This can be chemically shown as:

However, the addition of a hydrofluorocarbon gas appears to interfere with proper OES endpoint detection measurements under certain process conditions. Unless this problem is resolved, an alternative endpoint process to OES would be required.

Furthermore, the addition of $O_2$ is desirable to improve CD bias uniformity in the etch result. As the term is employed herein, CD bias uniformity refers to the degree of uniformity across the substrate surface by which the lateral dimensions of etched features are affected by the etch process. Improving CD bias uniformity is an important goal for device manufacturers.

However, the addition of $O_2$, while substantially improving CD bias uniformity, still does not solve the OES detection issues caused by the addition of the hydrofluorocarbon gas. In accordance with one embodiment of the present invention, chlorine ($Cl_2$) is further added to the etchant gas mixture that comprises the fluorocarbon, hydrofluorocarbon, and $O_2$ gases.

It is discovered by the inventors herein that the addition of the chlorine gas enables OES detection without adversely affecting the etch results. Instead of or in addition to chlorine, a halogen-containing gas that is other than a hydrofluorocarbon gas may also be employed to enable OES endpoint detection. Examples of such halogen-containing gases that are other than a hydrofluorocarbon gas include hydrogen bromide (HBr) and/or hydrogen chloride (HCl) and/or bromine ($Br_2$) and/or boron trichloride ($BCl_3$).

In the following paragraphs, approximate ranges believed to be suitable for performing the inventive method of improving process results through the introduction of additional gasses into a plasma processing chamber are disclosed. Although the suitable ranges are disclosed herein below in connection with a TCP® 9400 or a 2300 Versys™ Silicon or a 2300 Versys Star™ Silicon plasma processing system, available from Lam Research Corporation of Fremont, Calif., these ranges should serve as guidelines to enable one skilled in the art to adapt the disclosed methods to other plasma processing systems.

In one example, the addition of $Cl_2$ (chlorine gas) and $O_2$ (oxygen gas) to $CH_2F_2$ (a hydrofluorocarbon gas) and $CF_4$ (a fluorocarbon gas) in a plasma processing system can reduce CD bias, improves CD bias uniformity, and still allows proper endpoint detection. This can be chemically shown as:

In one embodiment of the invention, the addition of about 1% to about 97% $O_2$ and about 1% to about 97% $Cl_2$ to a mixture of about 1% to about 97% CH$_2$F$_2$ and about 1% to about 97% CF$_4$ (with 100% being the sum of the percentages of the constituent gases), substantially reduces the CD bias, improves CD bias uniformity, and allows proper endpoint detection using OES.

In another embodiment of the invention, the addition of about 2% to about 50% O$_2$ and about 2% to about 50% Cl$_2$ to a mixture of about 20% to about 70% CH$_2$F$_2$ and about 5% to about 60% CF$_4$ (with 100% being the sum of the percentages of the constituent gases), substantially reduces the CD bias, improves CD bias uniformity, and allows proper endpoint detection using OES.

In another embodiment of the invention, the addition of about 5% to about 30% O$_2$ and about 5% to about 30% Cl$_2$ to a mixture of about 30% to about 60% CH$_2$F$_2$ and about 10% to about 50% CF$_4$ (with 100% being the sum of the percentages of the constituent gases), attenuates lateral etching sufficiently to substantially reduces CD bias, improves CD bias uniformity, and allows proper endpoint detection using OES.

In accordance with embodiments of the invention, the mixture may comprise Cl$_2$ (and/or one of the halogen-containing gases discussed earlier), O$_2$, and hydrofluorocarbon gas(es) without any substantial amount of fluorocarbon gas. Generally speaking, a hydrofluorocarbon gas molecule has the following composition:

$$C_X H_Y Cl_A F_B Br_C I_D$$

Where C is the element carbon with X being greater than 0, H is the element hydrogen with Y being greater than 0, Cl is the element chlorine with A being equal to or greater than 0, F is the element fluorine with B being equal to or greater than 0, Br is the element bromine with C being equal to or greater than 0, and I is the element iodine with D being equal to or greater than 0. Examples of alternative hydrofluorocarbon gases that may be used include CHF$_3$ and CH$_3$F.

Generally speaking, a fluorocarbon gas molecule, when employed in the etch, may have the following composition:

$$C_M F_N$$

Where C is the element carbon with M being greater than 0, and F is the element fluorine with N being greater than 0. Examples of alternative fluorocarbon gases that may be used include C$_2$F$_6$ and C$_4$F$_8$. Of course, it is possible in some applications to employ both fluorocarbon and hydrofluorocarbon gases in a mixture that also includes chlorine and oxygen gases.

Figure 3A:
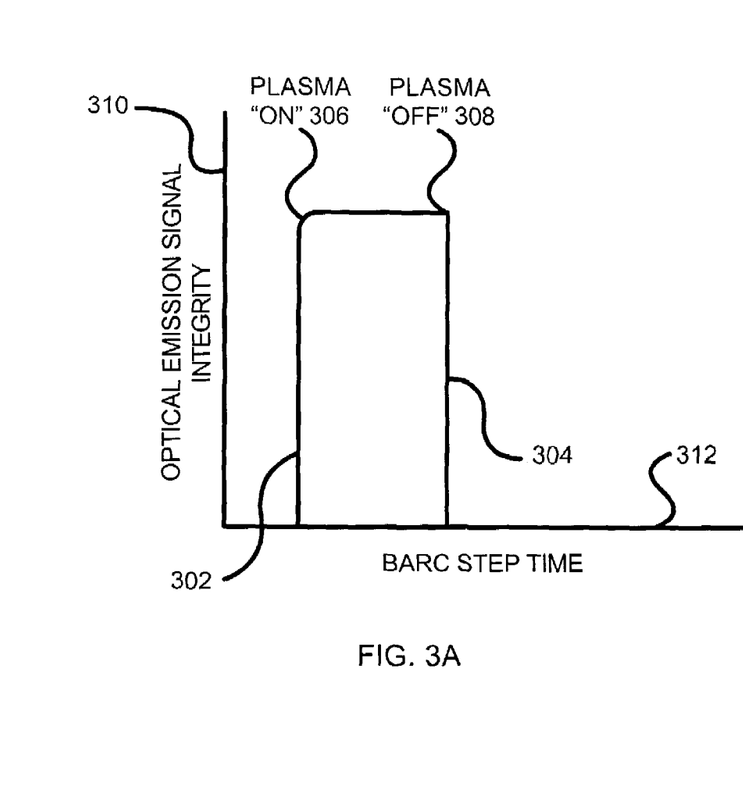
FIGS. 3A-B illustrate, in accordance with embodiments of the present invention, simplified optical emission intensity diagrams obtained while etching a BARC-containing layer stack.
Figure 3B:
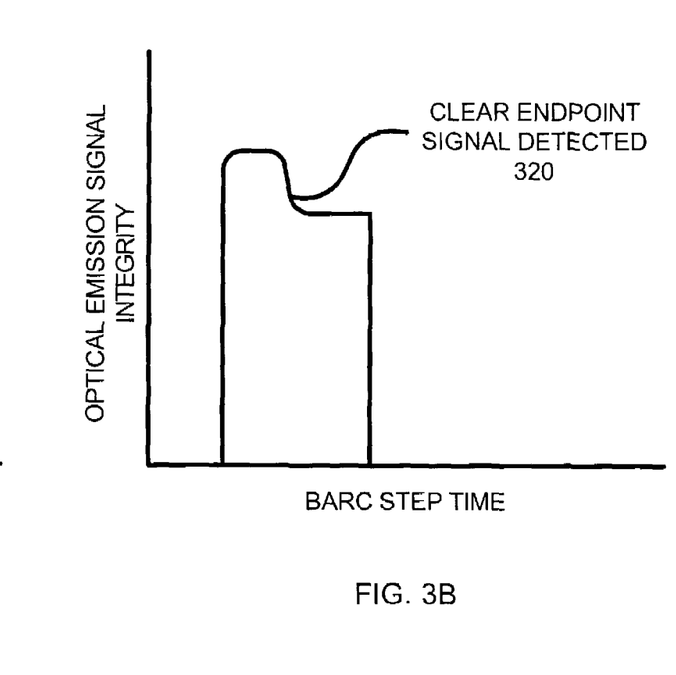

FIGS. 3A-B illustrate, in accordance with embodiments of the present invention, simplified optical emission intensity diagrams obtained while etching a BARC-containing layer stack. In both FIGS. 3A and 3B, oxygen, hydrofluorocarbon, and fluorocarbon gases are employed. FIG. 3A displays a diagram in which chlorine gas is not present. FIG. 3B displays the corresponding diagram with the presence of chlorine gas.

Referring now to FIG. 3A, optical emission signal intensity 310 is shown on the vertical axis, while BARC step time 312 is shown on the horizontal axis. Curve 302 measures the optical signal relative to time during the plasma etch process, which starts at plasma "on" 306, and ends at plasma "off" 308. As can be seen in the diagram 304, there is no clear change in the optical emission signal to determine that the proper amount of etching has occurred.

In the case of FIG. 3B, the etchants include a fluorocarbon gas, a hydrofluorocarbon gas, O$_2$, and chlorine. As can be seen in the diagram 334, there is a clear change in the optical emission signal (indicated by reference number 320) between the time the plasma is turned on and the time the plasma is turned off. It is believed by the inventor that the use of a halogen-containing gas (other than the hydrofluorocarbon gas) has resulted in a detectable change in optical emission signal intensity when the BARC layer is etched through, which change may be employed to end-point the BARC etch step.

Example

Figure 4:
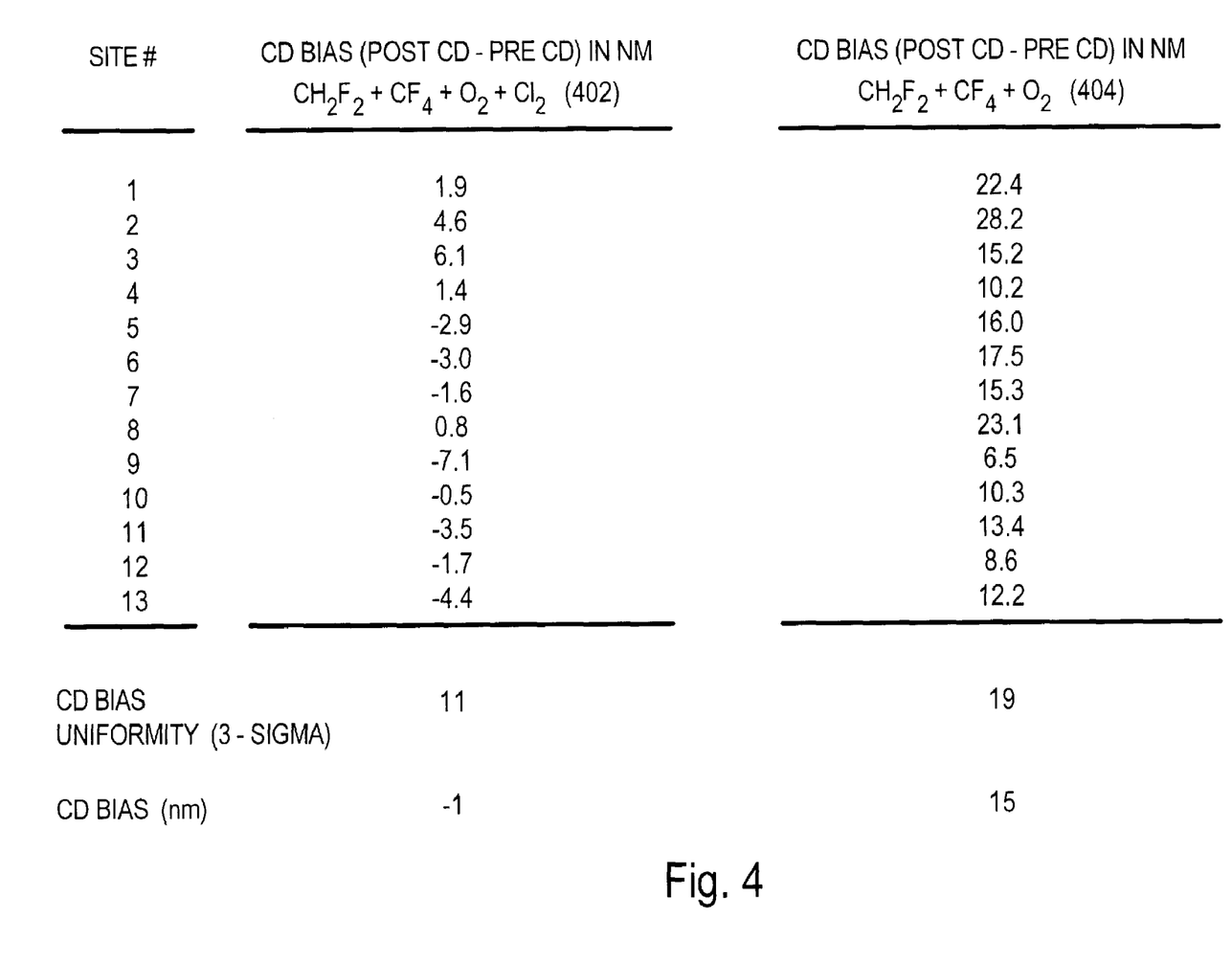
FIG. 4 is a table showing the effect of variable gas flows on CD bias and CD bias uniformity in an exemplary etch.

Referring to FIG. 4, in accordance with another aspect of the invention, a simplified table is shown comparing a sample plasma etch 402 including Cl$_2$ and O$_2$, to a sample plasma etch 404 including O$_2$ but not Cl$_2$. For both, a substrate having in sequential order thereon, a polysilicon layer, a BARC layer, and a photo-resist layer, is placed into a TCP™ 9400DFM plasma reactor, which is available from the aforementioned Lam Research Corporation. For the purposes of illustration, the pressure within the plasma reactor chamber interior is, in milliTorr, about 13 mT. The helium flow within the plasma reactor chamber interior is, in Torr, about 8 T. The electrode power is about 640 Watts. And the bias voltage is about −295 volts.

In sample etch 402, the gas mixture is comprised of about 90 sccm of CH$_2$F$_2$, about 30 sccm of CF$_4$, about 30 sccm of Cl$_2$, and about 35 sccm of 2.

In sample etch 404, the gas mixture is comprised of about 60 sccm of CH$_2$F$_2$, about 60 sccm of CF$_4$, and about 20 sccm of O$_2$.

In comparison, sample etch 402 has substantially less CD bias uniformity than sample etch 404, 11 nm as opposed to 19 nm at 3 sigma; Further, the CD bias for sample etch 402 is also less than the CD bias for sample etch 404.

at site #1, sample etch 402 has a CD bias of 1.9 nm, as opposed to sample etch 404 with a CD bias of 22.4 nm;
at site #2, sample etch 402 has a CD bias of 4.6 nm, as opposed to sample etch 404 with a CD bias of 28.2 nm;
at site #3, sample etch 402 has a CD bias of 6.1 nm, as opposed to sample etch 404 with a CD bias of 15.2 nm;
at site #4, sample etch 402 has a CD bias of 1.4 nm, as opposed to sample etch 404 with a CD bias of 10.2 nm;
at site #5, sample etch 402 has a CD bias of −2.9 nm, as opposed to sample etch 404 with a CD bias of 16.0 nm;
at site #6, sample etch 402 has a CD bias of −3.0 nm, as opposed to sample etch 404 with a CD bias of 17.5 nm;
at site #7, sample etch 402 has a CD bias of −1.6 nm, as opposed to sample etch 404 with a CD bias of 15.3 nm;
at site #8, sample etch 402 has a CD bias of 0.8 nm, as opposed to sample etch 404 with a CD bias of 23.1 nm;
at site #9, sample etch 402 has a CD bias of −7.1 nm, as opposed to sample etch 404 with a CD bias of 6.5 nm;
at site #10, sample etch 402 has a CD bias of −0.5 nm, as opposed to sample etch 404 with a CD bias of 10.3 nm;
at site #11, sample etch 402 has a CD bias of −3.5 nm, as opposed to sample etch 404 with a CD bias of 13.4 nm;
at site #12, sample etch 402 has a CD bias of −1.7 nm, as opposed to sample etch 404 with a CD bias of 8.6 nm; and,
at site #13, sample etch 402 has a CD bias of −4.4 nm, as opposed to sample etch 404 with a CD bias of 12.2 nm.

As can be seen, the use of both a halogen-containing gas that is other than a hydrofluorocarbon gas and oxygen in a mixture comprising fluorocarbon and hydrofluorocarbon substantially reduces CD bias, improves CD bias uniformity, and at the same time allows the use of OES end point technique for the BARC etch step.

While this invention has been described in terms of several preferred embodiments, there are alterations, permutations, and equivalents which fall within the scope of this invention. For example, although the endpoint detection scheme discussed herein is OES, other endpoint detection schemes (such as interferometry or electrical parameter measurement) may also be employed. Further, although transformer coupled plasma etchers are discussed in connection with certain examples herein, the invention should not be limited to any particular type of plasma etcher or any particular technology for igniting, sustaining, and/or controlling the plasma. It should also be noted that there are many alternative ways of implementing the methods of the present invention. It is therefore intended that the following appended claims be interpreted as including all such alterations, permutations, and equivalents as fall within the true spirit and scope of the present invention.

What is claimed is:

1. In a plasma processing chamber, a method of etching an anti-reflective layer on a substrate, comprising:
   introducing said substrate having thereon an underlying layer, said anti-reflective layer above said underlying layer, and a photo-resist layer above said anti-reflective layer into said chamber;
   flowing a gas mixture into said chamber, said gas mixture consisting of a flow of $CH_2F_2$ gas, a flow of at least one of $CF_4$, $C_2F_6$, and $C_4F_8$ gas, a flow of $Cl_2$ gas, and a flow of oxygen gas;
   striking a plasma from said gas mixture; and
   etching said anti-reflective layer with said plasma.

2. The method of claim 1, wherein said at least one of $CF_4$, $C_2F_6$, and $C_4F_8$ gas is $C_4F_8$.

3. The method of claim 1, wherein said at least one of $CF_4$, $C_2F_6$, and $C_4F_8$ gas is $CF_4$.

4. The method of claim 1, wherein said at least one or $CF_4$, $C_2F_6$, and $C_4F_8$ gas is $C_2F_6$.

5. The method of claim 1, wherein said flow of said $CH_2F_2$ gas is about 20% to about 70% of said gas mixture by flow rate.

6. The method of claim 1, wherein said flow of said $Cl_2$ gas is about 2% to about 50% of said gas mixture by flow rate.

7. The method of claim 1, wherein said flow of said oxygen gas is about 2% to about 50% of said gas mixture by flow rate.

8. The method of claim 1, wherein said flow of said $CH_2F_2$ gas is about 30% to about 60% of said gas mixture by flow rate.

9. The method of claim 1, wherein said flow of said $Cl_2$ gas is about 5% to about 30% of said gas mixture by flow rate.

10. The method of claim 1, wherein said flow of said oxygen gas is about 5% to about 30% of said gas mixture by flow rate.

11. In a plasma processing chamber, a method of etching an anti-reflective layer on a substrate, comprising:
    introducing said substrate having thereon an underlying layer, said anti-reflective layer above said underlying layer, and a photo-resist layer above said anti-reflective layer into said chamber;
    flowing a gas mixture into said chamber, said gas mixture consisting of a flow of $CH_2F_2$ gas, a flow of at least one of $CF_4$, $C_2F_6$, and $C_4F_8$ gas, a flow of $Cl_2$ gas, and a flow of oxygen gas;
    striking a plasma from said gas mixture; and
    etching at least through said anti-reflective layer with said plasma.

12. The method of claim 11, wherein said underlying layer is a polysilicon layer.

13. The method of claim 11, wherein said flow of said $CH_2F_2$ gas is about 20% to about 70% of said gas mixture by flow rate.

14. The method of claim 13, wherein said flow of said at least one of $CF_4$, $C_2F_6$, and $C_4F_8$ gas is about 5% to about 60% of said gas mixture by flow rate.

15. The method of claim 14, wherein said flow of said $Cl_2$ gas is about 2% to about 50% of said gas mixture by flow rate.

16. The method of claim 15, wherein said flow of said oxygen gas is about 20% to about 50% of said gas mixture by flow rate.

17. The method of claim 11, wherein said flow of said $CH_2F_2$ gas is about 30% to about 60% of said gas mixture by flow rate.

18. The method of claim 17, wherein said flow of said $Cl_2$ gas is about 5% to about 30% of said gas mixture by flow rate.

19. The method of claim 18, wherein said flow of said at least one of $CF_4$, $C_2F_6$, and $C_4F_8$ gas is about 10% to about 50% of said gas mixture by flow rate.

20. The method of claim 19, wherein said flow or said oxygen gas is about 5% to about 30% of said gas mixture by flow rate.

* * * * *